United States Patent
Nanba et al.

(10) Patent No.: US 7,927,429 B2
(45) Date of Patent: Apr. 19, 2011

(54) SUBSTRATE CLEANING METHOD, SUBSTRATE CLEANING APPARATUS AND COMPUTER READABLE RECORDING MEDIUM

(75) Inventors: Hiromitsu Nanba, Koshi (JP); Takashi Yabuta, Tosu (JP); Takehiko Orii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1151 days.

(21) Appl. No.: 10/577,314

(22) PCT Filed: Nov. 12, 2004

(86) PCT No.: PCT/JP2004/016842
§ 371 (c)(1),
(2), (4) Date: Apr. 28, 2006

(87) PCT Pub. No.: WO2005/050724
PCT Pub. Date: Jun. 2, 2005

(65) Prior Publication Data
US 2007/0131256 A1 Jun. 14, 2007

(30) Foreign Application Priority Data
Nov. 18, 2003 (JP) .................. 2003-387728

(51) Int. Cl.
*B08B 7/00* (2006.01)
(52) U.S. Cl. .......................... 134/33; 134/94.1
(58) Field of Classification Search .......... None
See application file for complete search history.

(56) References Cited

U.S. PATENT DOCUMENTS

| | | | |
|---|---|---|---|
| 5,997,653 A | 12/1999 | Yamasaka | |
| 6,058,945 A * | 5/2000 | Fujiyama et al. | 134/1.3 |
| 2002/0130106 A1 | 9/2002 | Mertens et al. | |
| 2003/0075204 A1* | 4/2003 | de Larios et al. | 134/21 |
| 2003/0084925 A1 | 5/2003 | Nakajima et al. | |
| 2008/0173333 A1* | 7/2008 | Nanba et al. | 134/30 |

FOREIGN PATENT DOCUMENTS

| | | |
|---|---|---|
| JP | 04-287922 | 10/1992 |
| JP | 10-303169 | 11/1998 |
| JP | 11-233480 | 8/1999 |
| JP | 2001-053051 | 2/2001 |
| JP | 2002-057088 | 2/2002 |
| JP | 2002-075949 | 3/2002 |
| JP | 2003-017461 | 1/2003 |
| JP | 2003-031545 | 1/2003 |
| JP | 2003-197590 | 7/2003 |

OTHER PUBLICATIONS

Austrian Search Report, dated Apr. 23, 2007, in connection with PCT/JP2004/016842.

* cited by examiner

*Primary Examiner* — Michael Barr
*Assistant Examiner* — Eric Golightly
(74) *Attorney, Agent, or Firm* — Smith, Gambrell & Russell, LLP

(57) ABSTRACT

After a rinse process on a wafer W is performed by feeding pure water to the surface of the wafer W at a predetermined flow rate while rotating the wafer W in an approximately horizontal state, a feed amount of the pure water to the wafer W is reduced, and a pure-water feed point is moved outward from the center of the wafer W. In this manner, the wafer W is subjected to a spin dry process while forming a liquid film in a substantially outer region of the pure-water feed point.

12 Claims, 11 Drawing Sheets

SUBSTRATE CLEANING METHOD, SUBSTRATE CLEANING APPARATUS AND COMPUTER READABLE RECORDING MEDIUM

TECHNICAL FIELD

The present invention relates to a substrate cleaning method capable of suppressing generation of water marks on the surface of a substrate to be processed, such as a semiconductor wafer or a glass substrate for FPD (Flat Panel Display), a substrate cleaning apparatus and a computer readable recording medium for executing the substrate cleaning method.

BACKGROUND ART

In a semiconductor device fabrication process, for example, as the surface of a semiconductor wafer should always be kept clean, a cleaning process is performed on the semiconductor wafer approximately. As a typical example of a single wafer type cleaning process of processing semiconductor wafers one by one, a process method is known which feeds a predetermined cleaning liquid to a semiconductor wafer held by a spin chuck (chemical liquid cleaning process), then feeds pure water to the semiconductor wafer to rinse the cleaning liquid (rinse process), and further rotates the semiconductor wafer at a high speed to spin the pure water off the semiconductor wafer (spin dry process).

Such a process method has a problem such that water marks is generated on the surface of a semiconductor wafer by adhesion of a mist of pure water, which is generated at the time of spin dry, to the dry surface of the semiconductor wafer, or the like.

As a cleaning method which suppresses generation of such water marks, Unexamined Japanese Patent Application Publication No. H4-287922 discloses a substrate processing method which comprises a cleaning process step of feeding a predetermined cleaning liquid to the surface of a substrate to be processed from obliquely above, a rinse process step of then feeding pure water to the surface of the substrate from obliquely above, and a dry process step of then rotating the substrate at a high speed to spin the liquid off, and overlaps the end period of the rinse process step and the start period each other, whereby a nitrogen gas is supplied to the center portion of the substrate in the overlap step and the dry process step.

Unexamined Japanese Patent Application Publication No. 2001-53051 discloses a substrate dry method which sprays an inactive gas to the center portion of a substrate after a rinse process, sprays pure water to the outer peripheral portion of the substrate, and moves the spray position of the inactive gas and the spray position of the pure water outward from the substrate in the radial direction.

As the semiconductor device fabrication process progresses, however, a pattern having a mixture of a hydrophilic surface (e.g., an $SiO_2$ surface formed by a predetermined method) and a hydrophobic surface (e.g., a bare Si surface) is formed on the surface of the semiconductor wafer. Because the hydrophilic surface and the hydrophobic surface differ from each other in the water spin-off speed at the time of the spin dry process, the aforementioned conventional spin dry method has a difficulty in avoiding generation of water marks.

DISCLOSURE OF INVENTION

The present invention has been made in view of the above situations, and aims at providing a substrate cleaning method capable of suppressing generation of water marks. It is an object of the present invention to provide a substrate cleaning apparatus and a computer readable recording medium for executing the substrate cleaning method.

According to the first aspect of the invention, there is provided a substrate cleaning method comprising: performing a rinse process on a substrate to be processed with pure water supplied to a surface thereof while rotating the substrate in a substantially horizontal state; and thereafter performing a spin dry process on the substrate while forming a liquid film in a substantially outer region of a pure-water feed point to the substrate by making a feed amount of the pure water to the substrate smaller than that at a time of the rinse process and moving the pure-water feed point to the substrate outward from a center of the substrate.

It is preferable that in such a substrate cleaning method, a speed of moving the pure-water feed point to the substrate outward from the center of the substrate should be made faster at an outer peripheral portion of the substrate than at the center portion thereof. Because it is difficult for centrifugal force to substantially act on pure water at the center portion of the substrate and drying is difficult as it is, favorably used is a method such that when the pure-water feed point to the substrate reaches a position separated from the center of the substrate by a predetermined distance, movement of the pure-water feed point is temporarily stopped, and a nitrogen gas is sprayed to the center portion of the substrate, after which spraying of the nitrogen gas is stopped and the pure-water feed point is moved out of the substrate again.

Further, it is a preferable method that the pure-water feed point to the substrate is rapidly moved to a position separated from the center of the substrate by 10 to 15 mm, where movement of the pure-water feed point is temporarily stopped, and a nitrogen gas is sprayed to the center portion of the substrate for a predetermined time, after which spraying of the nitrogen gas is stopped and the pure-water feed point is moved out of the substrate again at a speed equal to or less than 3 mm/second.

Furthermore, it is possible to take a method such that after the pure-water feed point to the substrate is shifted from the center of the substrate by a predetermined distance, a nitrogen gas is sprayed to the center portion of the substrate, then a spray point of the nitrogen gas is moved, together with the pure-water feed point, outward from the center portion of the substrate while spraying the nitrogen gas to the substrate. In addition, as substantial centrifugal force acts on pure water at an outer portion of the substrate, it is also preferable that after the pure-water feed point to the substrate is shifted from the center of the substrate by a predetermined distance, a nitrogen gas should be sprayed to the center portion of the substrate, after which while spraying the nitrogen gas to the substrate, a spray point of the nitrogen gas should be moved, together with the pure-water feed point, outward from the center portion of the substrate, during which only spraying of the nitrogen gas should be stopped.

It is preferable that a number of rotations of the substrate in the rinse process should be set equal to or greater than 100 rpm and equal to or less than 1000 rpm. When, in the spin dry process, a nitrogen gas is sprayed to the center portion of the substrate, and a spray point of the nitrogen gas is moved, together with the pure-water feed point, outward of the substrate, a number of rotations of the substrate has only to be set equal to or greater than 800 rpm. It is preferable that the number of rotations of the substrate in the spin dry process should be equal to or less than 2500 rpm from the view point of preventing generation of particles or water marks originating from misting or pure water splashed from the substrate, or the like.

When no nitrogen gas is fed to the substrate at the time of spin dry, by way of contrast, it is preferable that a number of rotations of the substrate at a time of the spin dry process should be set greater than a number of rotations of the substrate at a time of the rinse process. Specifically, it is preferable that a number of rotations of the substrate should be set equal to or greater than 100 rpm and equal to or less than 1000 rpm in the rinse process, and a number of rotations of the substrate should be set equal to or greater than 1500 rpm and equal to or less than 2500 rpm in the spin dry process. While the substrate cleaning method of the invention is used suitably when a mixture of a hydrophobic surface and a hydrophilic surface exists on the surface of the substrate, it of course can also be used when the surface of the substrate is only a hydrophobic surface or only a hydrophilic surface.

The invention provides a substrate cleaning apparatus for executing the substrate cleaning method. That is, according to the second aspect of the invention, there is provided a substrate cleaning apparatus comprising:

a spin chuck which holds and rotates a substrate to be processed in an approximately horizontal state;

a pure-water supply mechanism having a pure-water supply nozzle which discharges pure water to a surface of the substrate held by the spin chuck, and a pure-water supply section which supplies the pure water to the pure-water supply nozzle;

a pure-water nozzle scan mechanism which causes the pure-water supply nozzle to scan between above a center of the substrate and above an outer edge thereof; and a control section which controls the spin chuck, the pure-water supply mechanism and the pure-water nozzle scan mechanism in such a way as to perform a rinse process of feeding the pure water to a surface of the substrate at a predetermined flow rate while rotating the substrate held by the spin chuck, and then perform a spin dry process on the substrate while forming a liquid film in a substantially outer region of a pure-water feed point to the substrate by making a feed amount of the pure water to the substrate smaller than that at a time of the rinse process and moving the pure-water feed point to the substrate outward from a center of the substrate.

To perform the spin dry using a nitrogen gas, it is preferable that the substrate cleaning apparatus should further comprise a gas supply mechanism having a gas nozzle which sprays a nitrogen gas to a center portion of the surface of the substrate held by the spin chuck. It is preferable that the gas supply mechanism should be so constructed as to be controlled by the control section from the view point of smoothly processing the substrate.

It is preferable that the substrate cleaning apparatus should take such a structure as to further comprise a gas supply mechanism having a gas nozzle which sprays a nitrogen gas to the surface of the substrate held by the spin chuck, and a gas nozzle scan mechanism which causes the gas nozzle to scan on the substrate. Even in this case, as the gas supply mechanism and the gas nozzle scan mechanism take such structures as to be controlled by the control section, it is possible to smoothly process the substrate.

The invention provides a computer readable recording medium having recorded a program which allows a computer that controls such a substrate cleaning apparatus to execute the substrate cleaning method. That is, according to the third aspect of the invention, there is provided a computer readable recording medium having recorded a program for allowing a computer that controls a substrate cleaning apparatus, which performs a rinse process by supplying pure water to a substrate to be processed while rotating the substrate held in an approximately horizontal state, to execute a process of (a) performing a rinse process of feeding the pure water to a surface of the substrate at a predetermined flow rate while rotating the substrate held by the spin chuck, and (b) performing spin dry on the substrate while forming a liquid film in a substantially outer region of a pure-water feed point to the substrate by making a feed amount of the pure water to the substrate smaller than that at a time of the rinse process and moving the pure-water feed point to the substrate outward from a center of the substrate.

According to the fourth aspect of the invention, there is provided another recording medium according to the structure of the substrate cleaning apparatus, i.e., a computer readable recording medium having recorded a program for allowing a computer that controls a substrate cleaning apparatus, which performs a rinse process by supplying pure water to a substrate to be processed while rotating the substrate held in an approximately horizontal state, and further performs spin dry by feeding a nitrogen gas to the substrate, to execute a process of (a) performing a rinse process of feeding the pure water to a surface of the substrate at a predetermined flow rate while rotating the substrate held by the spin chuck, (b) making a feed amount of the pure water to the substrate smaller than that at a time of the rinse process and moving a pure-water feed point to the substrate outward from a center of the substrate, (c) when the pure-water feed point to the substrate reaches a position separated from the center of the substrate by a predetermined distance, temporarily stopping movement of the pure-water feed point, and spraying a nitrogen gas to the center portion of the substrate, and (d) after spraying of the nitrogen gas is stopped, the pure-water feed point is moved out of the substrate again, thereby performing spin dry on the substrate while forming a liquid film in a substantially outer region of the pure-water feed point.

According to the fifth aspect of the invention, there is provided a still another recording medium according to the structure of the substrate cleaning apparatus, i.e., a computer readable recording medium having recorded a program for allowing a computer that controls a substrate cleaning apparatus, which performs a rinse process by supplying pure water to a substrate to be processed while rotating the substrate held in an approximately horizontal state, and further performs spin dry by feeding a nitrogen gas to the substrate, to execute a process of (a) performing a rinse process of feeding the pure water to a surface of the substrate at a predetermined flow rate while rotating the substrate held by the spin chuck, (b) making a feed amount of the pure water to the substrate smaller than that at a time of the rinse process and moving a pure-water feed point to the substrate outward from a center of the substrate, (c) when the pure-water feed point to the substrate reaches a position separated from the center of the substrate by a predetermined distance, temporarily stopping movement of the pure-water feed point, and spraying a nitrogen gas to the center portion of the substrate, and (d) a spray point of the nitrogen gas is moved, together with the pure-water feed point, outward from the center portion of the substrate while spraying the nitrogen gas to the substrate.

According to the invention, even when a mixture a hydrophobic surface and a hydrophilic surface exists, it is possible to make the difference between the dry time for the hydrophobic surface and the dry time for the hydrophilic surface smaller, so that a high precision substrate cleaning process which suppresses generation of water marks can be executed.

The invention is of course effective even when the surface of the substrate is comprised of only a hydrophobic surface, or comprised of only a hydrophilic surface.

BEST MODE FOR CARRYING OUT THE INVENTION

Figure 1:
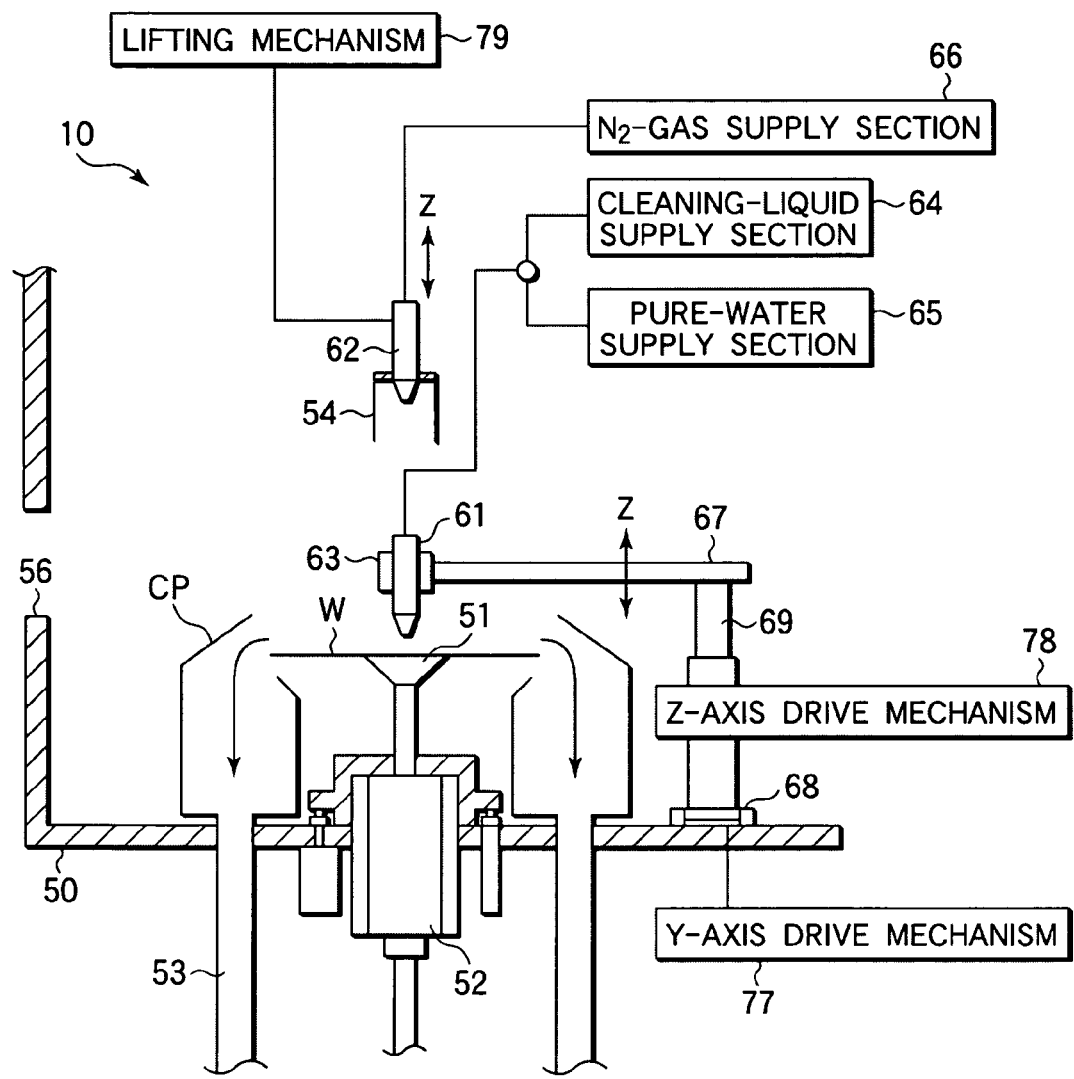
FIG. 1 is a vertical cross-sectional view showing the schematic structure of a substrate cleaning apparatus.
Figure 2:
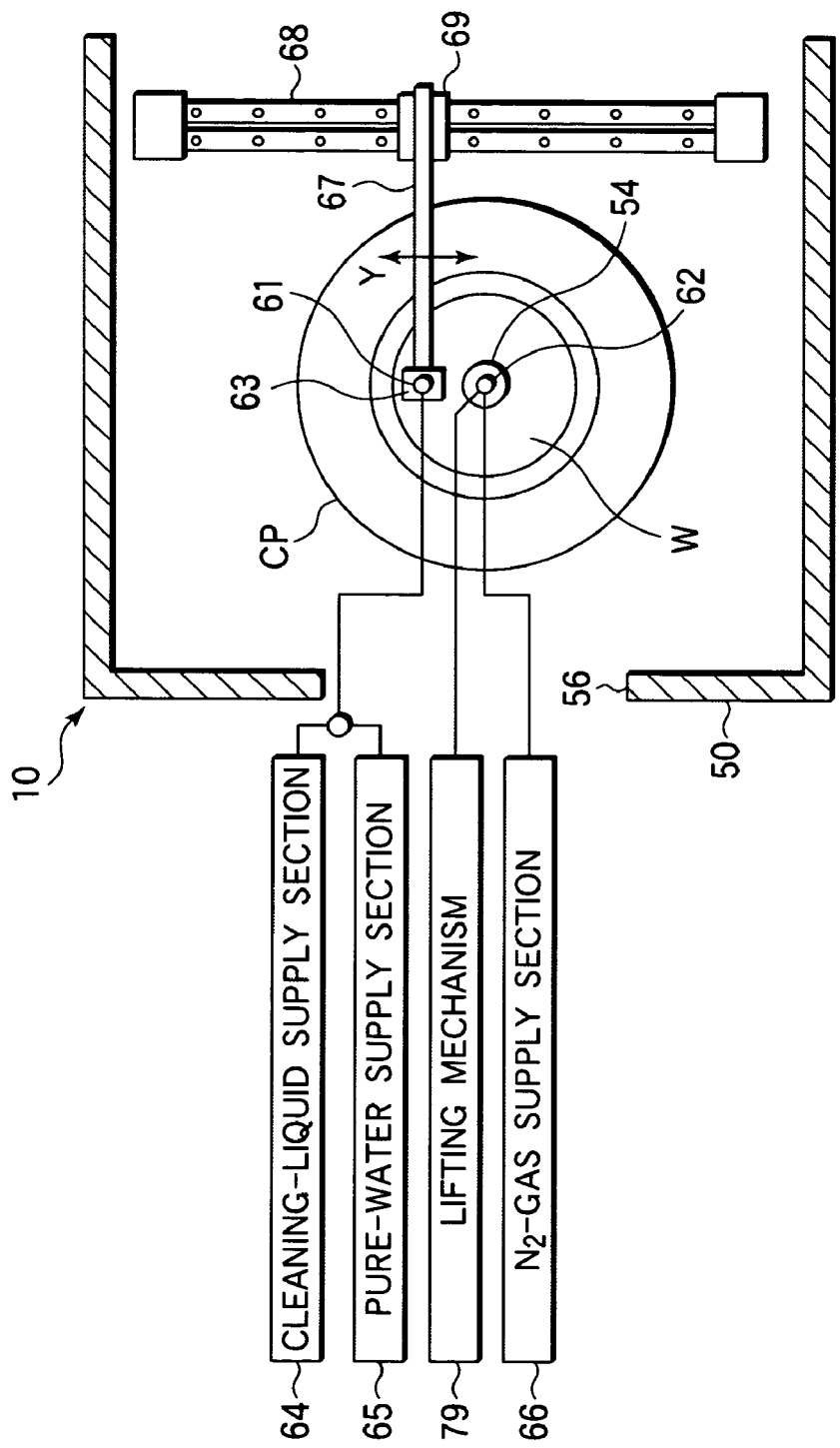
FIG. 2 is a plan view showing the schematic structure of the substrate cleaning apparatus.

An embodiment of the present invention will be described below with reference to the accompanying drawings. FIG. 1 presents a vertical cross-sectional view showing the schematic structure of a substrate cleaning apparatus 10 which cleans a semiconductor wafer, and FIG. 2 presents a plan view thereof.

The essential portions of the substrate cleaning apparatus 10 are provided in a casing 50. FIG. 1 and FIG. 2 show only a part of the casing 50. A ring-shaped cup CP is disposed in approximately the center of the casing 50, and a spin chuck 51 is placed inside the cup CP. A chuck which vacuum-chucks and holds a wafer W, or a so-called mechanical chuck type, such as one which mechanically holds the end faces of the wafer W, is preferably used as the spin chuck 51, which is rotated while holding the wafer W by a drive motor 52. A drain 53 for discharging a cleaning liquid and pure water is provided in the bottom of the cup CP, and a feed window 56 through which a wafer is transferred from outside and is transferred to the outside is formed in the vertical wall of the casing 50 of the substrate cleaning apparatus 10.

A process liquid nozzle 61 which feeds the cleaning liquid and pure water to the surface of the wafer W is structured in a substantially cylindrical shape, and is held, with its lengthwise direction set approximately vertically, by a nozzle holding member 63. The cleaning liquid or pure water is selectively fed to the process liquid nozzle 61 from a cleaning-liquid supply section 64 and a pure-water supply section 65 which is structured in such a way as to be able to change the flow rate by adjustment of the opening and closing of a valve. That is, the process liquid nozzle 61 functions as a nozzle to feed the cleaning liquid to the wafer W and a nozzle to feed the pure water to the wafer W. A so-called straight nozzle is preferably used as the process liquid nozzle 61. The nozzle holding member 63 is attached to the distal end portion of a scan arm 67.

The scan arm 67 is mounted to the upper end portion of a vertical support member 69 placed on a guide rail 68 laid on the bottom plate of the casing 50 in one direction (Y direction). The vertical support member 69 can be moved horizontally by a Y-axis drive mechanism 77, and has a Z-axis drive mechanism 78 for lifting the scan arm 67 up and down. Therefore, the process liquid nozzle 61 is movable over the wafer W in the Y direction, and is retractable out of the cup CP over the upper end of the cup CP.

An $N_2$ nozzle 62 which sprays nitrogen gas ($N_2$ gas) to the surface of the wafer W is also structured approximately cylindrically, and is placed, with its lengthwise direction set approximately vertically, above the center of the wafer W held by the spin chuck 51. The $N_2$ nozzle 62 is liftable up and down by a lifting mechanism 79. An $N_2$-gas supply section 66 feeds the $N_2$ gas to the $N_2$ nozzle 62.

A cylindrical cover 54 is attached to the $N_2$ nozzle 62 in such a way as to cover the distal end thereof. Of the cover 54 is not attached, the $N_2$ gas sprayed from the $N_2$ nozzle 62 would be concentrated on one point on the wafer W, scattering a mist of pure water on the wafer W upward. At this time, the mist's falling speed gets slower around the $N_2$ gas sprayed from the $N_2$ nozzle 62, raising a problem that the mist drops on dry portions of the wafer W to become particles. With the provision of the cover 54, however, that of the $N_2$ gas sprayed from the $N_2$ nozzle 62 which goes outward hits the cover 54, and downflows, so that the mist drops on a non-dried pure-water portion on the wafer W, and the pure-water portion will be removed later, thus suppressing generation of particles.

When the outside diameter of the $N_2$ nozzle 62 is 6 mm$\phi$ (the inside diameter; 4 mm$\phi$), for example, it is preferable that the inside diameter of the cover 54 should be 10 mm$\phi$ to 20 mm$\phi$. It is preferable to make the cover 54 and the $N_2$ nozzle 62 independently liftable so that the distance between the distal end of the $N_2$ nozzle 62 and the distal end of the cover 54 can be adjusted. Accordingly, the progress of drying of the wafer W can be controlled.

Figure 3:
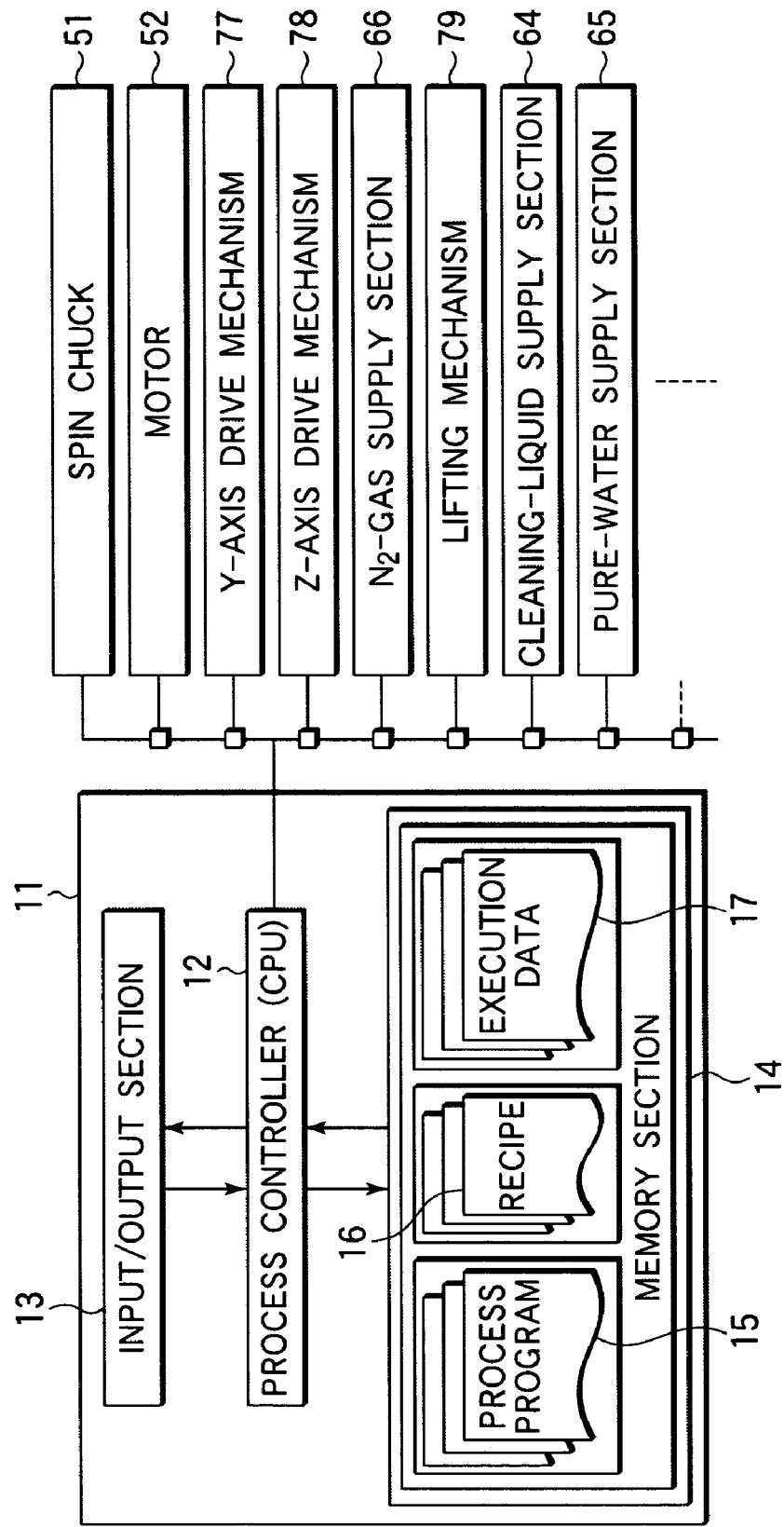
FIG. 3 is a diagram showing a schematic control system of the substrate cleaning apparatus.

FIG. 3 shows the structure of a schematic control system of the substrate cleaning apparatus 10. A control section (i.e., a computer) 11 for controlling the processing of the wafer W by the substrate cleaning apparatus 10 has a process controller (CPU) 12, a data input/output section 13 having a keyboard for a process operator to perform a command input operation or the like to determine the conditions or the like for the cleaning process for the wafer W, and a display or the like for displaying the results of arithmetic operations by the process controller (CPU) 12, the progress status of the cleaning process, and the like in a visible manner, and a memory section 14 where programs and recipes for controlling the substrate cleaning apparatus 10, data associated with executed processes, and so forth are recorded.

Recorded in the memory section 14 are specifically, process programs 15 for allowing the process controller (CPU) 12 to execute the operation control of various drive mechanisms constituting the substrate cleaning apparatus 10 for performing a series of processes including a cleaning process with a cleaning liquid, a rinse process with pure water, and a spin dry process, which will be explained in detail later, and recipes 16 recorded with the time allocation in a series of processes, the feed amount of a cleaning liquid, pure water, or the $N_2$ gas, the scan speed of the scan arm 67, and the like. Those process programs 15 and recipes 16 are recorded in various memory media, for example, a fixed storage medium, such as a hard disk (HD) or a memory (RAM or the like), and a portable type, such as a CD-ROM (or CD-R or the like), DVD-ROM (or DVD-R or the like) or MO disk, and are recorded in such a manner as to be readable by the process controller (CPU) 12.

The memory section 14 can record data about processes executed by the substrate cleaning apparatus 10, e.g., data 17 on the lot number for wafers W, a process recipe used, a process date, whether or not there is an operational failure in various mechanisms in process, and the like. Such data 17 can be coped or transferred to various kinds of portable memory media, such as a CD-R and MO disk.

According to the process program 15 and the recipe 16, the process controller (CPU) 12 sends various mechanisms or the like various controls signals on the chuck/unchuck of a wafer W by the spin chuck 51, the control of the number of rotations of the motor 52, the scan operation of the Y-axis drive mechanism 77, the lift operation of the Z-axis drive mechanism 78, the start and stop of the supply of pure water and the control of the flow rate of pure water from the pure-water supply section 65, the start and stop of the supply of the $N_2$ gas from the $N_2$-gas supply section 66, and so forth. Also preferable is the configuration that carries out bidirectional communications to feed data indicative of execution of the operations of various mechanisms constituting the substrate cleaning apparatus 10 back to the process controller (CPU) 12 from the mechanisms. FIG. 3 shows only the main mechanisms or the like, not all the mechanisms, that are controlled by the process controller (CPU) 12.

Figure 4:
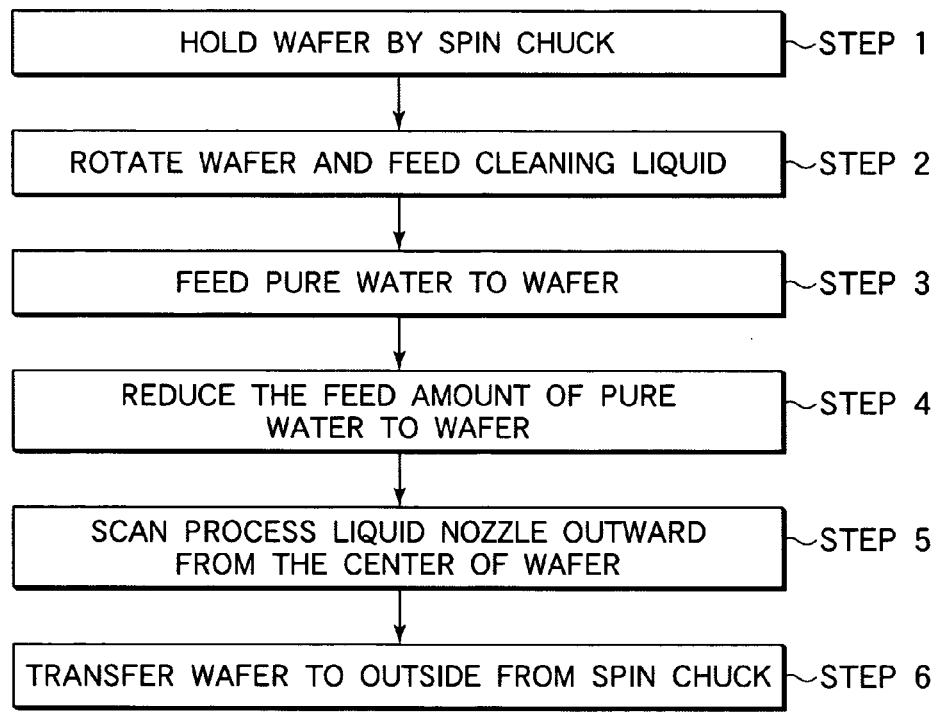
FIG. 4 is a flowchart illustrating a cleaning method.

Next, a substrate cleaning method for wafers W by the substrate cleaning apparatus 10 configured as mentioned above will be described. FIG. 4 shows a flowchart for cleaning steps to be described below. First, the wafer W is held substantially horizontal by the spin chuck 51, and the height of the wafer W is adjusted (step 1). The process liquid nozzle 61 is positioned above the center of the wafer W, a predetermined amount of cleaning liquid is fed to the surface of the wafer W while rotating the wafer W at a predetermined number of rotations, and the wafer W is processed for a predetermined time (step 2). In the process at step 2, the cleaning liquid may be fed to the surface of the wafer W set in a stationary state, forming puddles, and after a predetermined time elapses, the cleaning liquid may be further fed to the surface of the wafer W while rotating the wafer W.

Next, while the wafer W is rotated by a predetermined number of rotations (e.g., 100 rpm to 1000 rpm), pure water is fed to near the center of the wafer W from the process liquid nozzle 61 at a predetermined flow rate (e.g., 1 L/minute) to rinse the wafer W (step 3). In the rinse process, the process liquid nozzle 61 may be scanned over the wafer W in the Y direction.

At the end of such a rinse process, with the process liquid nozzle 61 set above the center of the wafer W, the feed amount of pure water to the wafer W (i.e., the amount of discharge of pure water from the process liquid nozzle 61) is reduced to, for example, 20 to 50 mL/minute (step 4), after which a pure-water feed point (i.e., the position of the process liquid nozzle 61) is moved outward from the center of the wafer W at a predetermined speed (step 5).

The following is the reason why the feed amount of pure water to the wafer W is reduced at step 4. It is preferable that the feed amount of pure water to the wafer W should be increased at the time of the rinse process to improve the rinse efficiency. If the scanning of the process liquid nozzle 61 is initiated at the flow rate unchanged, however, the liquid film formed on the wafer W is thick, so that pure water spun off the wafer W rebounds at the cup CP, generating a lot of droplets or mist which would cause generation of particles or water marks. Accordingly, reducing the feed amount of pure water to provide a thin liquid film repress such rebounding, thereby suppressing generation of particles or water marks. This method can quicken drying.

The spin dry step at steps 4 and 5 is terminated as the supply of pure water to the wafer W is stopped when the point of feeding pure water to the wafer W comes off the periphery of the wafer W. Thereafter, however, the wafer W may be rotated for a predetermined time. The wafer W whose spin dry process is finished is transferred from the spin chuck 51 to an apparatus which performs a next process (step 6).

Next, a further detailed description will be given of the aforementioned spin dry step at steps 4 and 5. FIGS. 5 to 8 are diagrams illustrating the conventional spin dry methods and the spin dry method at steps 4 and 5 in comparison with one another.

Figure 5:
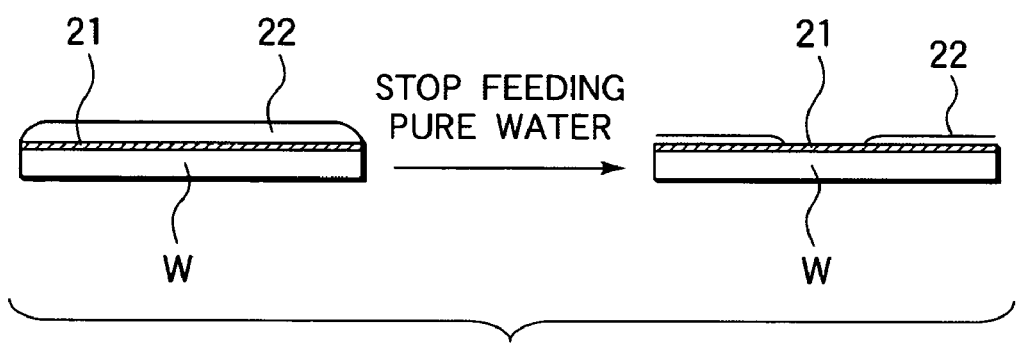
FIG. 5 is a diagram exemplarily illustrating the dry process for a wafer according to a conventional spin dry method.

FIG. 5 is a diagram exemplarily illustrating the conventional spin dry process for a wafer W which has a hydrophilic $SiO_2$ layer 21 formed on the entire surface. The left-hand figure of FIG. 5 shows pure water fed to the center of the wafer W and a puddle of pure water 22 on the surface of the wafer W. The right-hand figure of FIG. 5 shows the initial state where the supply of pure water to the wafer W is stopped and the wafer W is rotated by a predetermined number of rotations. When the entire surface of the wafer W is hydrophilic, the pure water 22 on the wafer W slowly moves outward of the wafer W so as to leave a thin liquid film (not shown) on the surface of the wafer W by the centrifugal force, so that the surface of the wafer W is slowly dried outward from the center.

Figure 6:
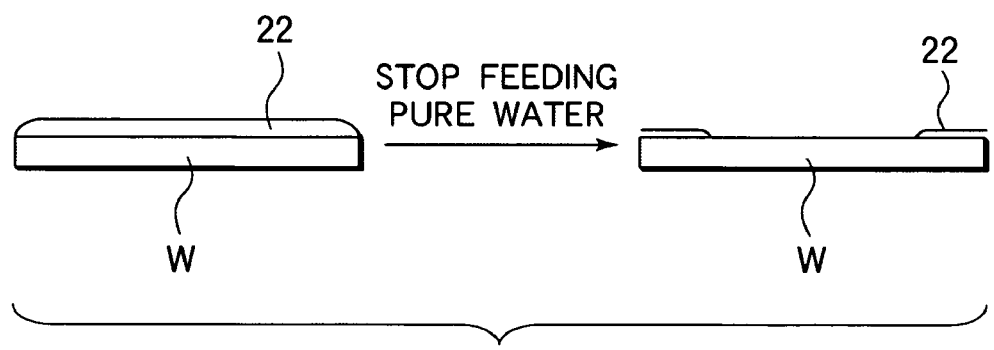
FIG. 6 is another diagram exemplarily illustrating the dry process for a wafer according to a conventional spin dry method.

FIG. 6 is a diagram exemplarily illustrating the conventional spin dry process for a wafer W (bare wafer) which has a hydrophobic surface. The left-hand figure of FIG. 6 shows pure water fed to the center of the wafer W and a puddle of pure water 22 on the surface of the wafer W. The right-hand figure of FIG. 6 shows the initial state where the supply of pure water to the wafer W is stopped and the wafer W is rotated by a predetermined number of rotations. As pure water is shed on the hydrophobic surface, the pure water on the surface of the wafer W is spun off at a blast by the centrifugal force, so that the entire surface of the wafer W is dried instantaneously. That is, with the same number of rotations of the wafer W, the hydrophobic surface is dried faster than the hydrophilic surface.

Figure 7:
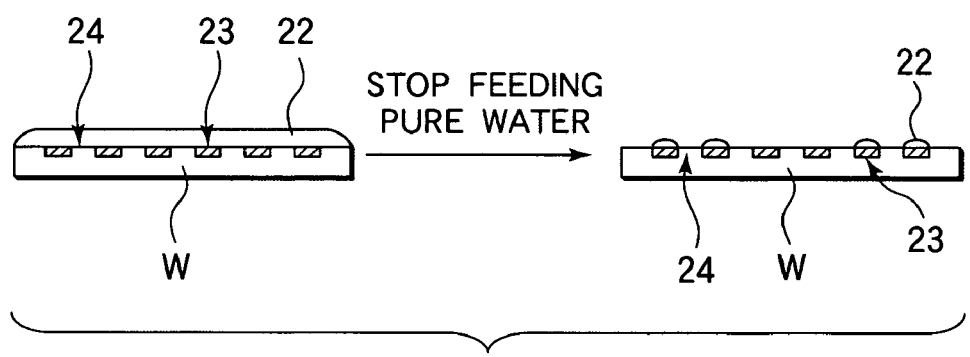
FIG. 7 is a still another diagram exemplarily illustrating the dry process for a wafer according to a conventional spin dry method.

FIG. 7 is a diagram exemplarily illustrating the conventional spin dry process for a wafer W which has a mixture of a hydrophilic surface portion 23 and a hydrophobic surface 24. The left-hand figure of FIG. 7 shows pure water fed to the center of the wafer W and a puddle of pure water 22 on the surface of the wafer W. The right-hand figure of FIG. 7 shows the initial state where the supply of pure water to the wafer W is stopped and the wafer W is rotated by a predetermined number of rotations. As there is a difference in dry time between a hydrophilic surface and a hydrophobic surface provided that the number of rotations of the wafer W is the same, as mentioned above, the mixture of the hydrophilic surface portion 23 and the hydrophobic surface 24, if present on the wafer W, causes the hydrophobic surface 24 to be dried first, leaving the pure water on the hydrophilic surface portion 23. It seems that the pure water 22 remaining on the hydrophilic surface portion 23 this way adheres to the hydrophobic surface 24 dried when the pure water 22 moves outward due to the centrifugal force, thereby generating water marks.

Figure 8:
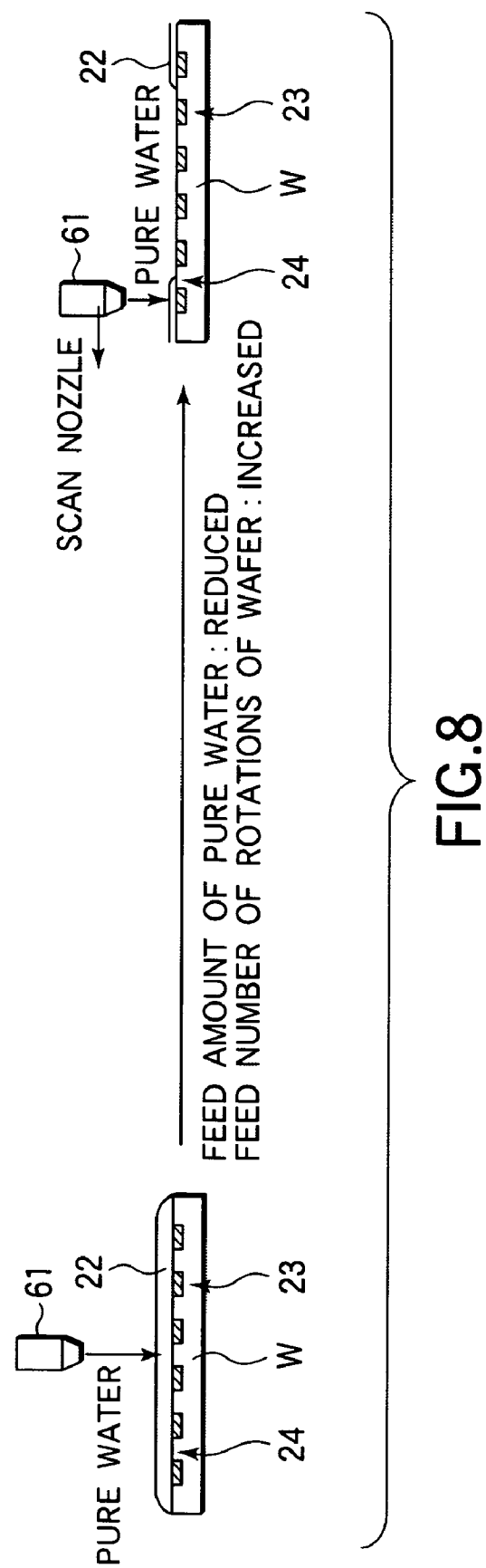
FIG. 8 is a diagram exemplarily illustrating the dry process for a wafer by spin dry in a cleaning method according to the present invention.

FIG. 8 is a diagram exemplarily illustrating the dry process for a wafer W which has a mixture of the hydrophilic surface portion 23 and the hydrophobic surface 24 according to the spin dry method at steps 4 and 5 described previously. The left-hand figure of FIG. 8 shows pure water fed to the center of the wafer W and a puddle of pure water 22 on the surface of the wafer W. The right-hand figure of FIG. 8 shows the state of the wafer W when feed amount of pure water to the wafer W is reduced and the pure-water feed point is moved outward of the wafer W from the center of the wafer W.

As shown in the right-hand figure of FIG. 8, according to the invention the spin dry method at steps 4 and 5 a liquid film of the pure water 22 is formed at a substantially outer region of the pure-water feed point, and the area where the liquid film is formed becomes narrower as the position of the process liquid nozzle 61 moves outward of the wafer W. That is, the wafer W can be slowly dried outward from the center thereof. Even when there is a mixture of the hydrophilic surface portion 23 and the hydrophobic surface 24 on the surface of the wafer W, therefore, the difference in dry time between the hydrophilic surface portion 23 and the hydrophobic surface 24 becomes smaller, suppressing generation of water marks.

According to the spin dry method at steps 4 and 5, it is preferable that the number of rotations of the wafer W at the time of the spin dry process should be set greater than the number of rotations of the wafer W at the time of the rinse process. For example, the number of rotations of the wafer W in the rinse process can be set equal to or greater than 100 rpm and equal to or less than 1000 rpm, in which case it is preferable that the number of rotations of the wafer W in the spin dry process should be set equal to or greater than 1500 rpm and equal to or less than 2500 rpm. This is because if the number of rotations of the wafer W is too slow, the dry times for the hydrophilic surface portion and the hydrophobic surface differ, bringing about a problem that water marks are likely to be generated, whereas if the number of rotations of the wafer W is too fast, a turbulence occurs around the wafer W and a mist of pure water scattered from the wafer W rides on the turbulence and readheres to the already-dried portion of the wafer W, thus making it easier to generate water marks.

The speed of moving the pure-water feed point to the wafer W outward from the center of the wafer W, i.e., the scan speed of the process liquid nozzle 61, can be changed according to the number of rotations of the wafer W in order to avoid generation of water marks. Table 1 shows the results of checking the positions at which an interference fringe disappears at the inner portion of the liquid film formed on the wafer W when scanning the process liquid nozzle 61 outward from the center of the wafer W at a constant speed (1 to 4 mm/second) while rotating the wafer W of 300 mmφ at a constant number of rotations and while feeding pure water to the wafer W from the process liquid nozzle 61 at 50 mL/minute.

TABLE 1

| | | number of rotations (rpm) | | | | |
|---|---|---|---|---|---|---|
| | | 1600 | 1800 | 2000 | 2200 | 2500 |
| nozzle scan speed (mm/second) | 1 | 40 mm | 35 mm | 30 mm | 25 mm | 20 mm |
| | 2 | 80 mm | 70 mm | 60 mm | 50 mm | 40 mm |
| | 3 | NG✕ | NG | 120 mm | 100 mm | 80 mm |
| | 4 | NG | NG | NG | NG | NG |

✕NG: an interference fringe did not disappear while the process liquid nozzle was scanned up to the periphery of the wafer Table 1 shows that with the number of rotations of the wafer W being 1600 rpm, when the process liquid nozzle 61 was scanned outward from the center of the wafer W at 1 mm/second, an interference fringe disappeared at a point at which the process liquid nozzle 61 was separated by 40 mm from the center of the wafer W, after which generation of no interference fringe was noticed while the process liquid nozzle 61 was scanned up to the periphery of the wafer W. It is understood from Table 1 that when the process liquid nozzle 61 was scanned at 2 mm/second, an interference fringe disappeared at a point at which the process liquid nozzle 61 was separated by 80 mm from the center of the wafer W, after which generation of no interference fringe was noticed. When the process liquid nozzle 61 was scanned at 3 mm/second or 4 mm/second, by way of contrast, an interference fringe was always observed until the process liquid nozzle 61 reached the periphery of the wafer W. That is, it is understood that under this condition, an interference fringe did not disappear from the beginning to the end, and generation of water marks could not be suppressed.

It is understood from Table 1 that with the scan speed of the process liquid nozzle 61 being constant, the position at which an interference fringe disappears comes closer to the center of the wafer W if the number of rotations of the wafer W is increased, whereas with the number of rotations of the wafer W being constant, the position at which an interference fringe disappears comes closer to the center of the wafer W if the scan speed of the process liquid nozzle 61 is slow. It is apparent from this that when the rotational speed of the wafer W is fast and when the scan speed of the process liquid nozzle 61 is slow, generation of an interference fringe can be suppressed.

If the wafer W is entirely scanned with the scan speed of the process liquid nozzle 61 being, for example, 1 mm/second, however, the process time becomes long and the productivity drops. When the number of rotations of the wafer W is set constant, therefore, the process time can be shortened by making the scan speed of the process liquid nozzle 61 faster at the outer peripheral portion of the wafer W than at the center portion thereof. When the number of rotations of the wafer W (300 mmφ) is 2500 rpm, for example, the scan speed of the process liquid nozzle 61 can be set to 1 mm/second within the radius of 40 mm from the center of the wafer W, set to 2 mm/second from the radius of 40 mm to the radius of 80 mm, and set to 3 mm/second from the radius of 80 mm to the periphery (the radius: 150 mm).

Instead of the method of slowing scanning the process liquid nozzle 61 outward from the center of the wafer W, a method of rapidly moving the process liquid nozzle 61 (e.g., 80 mm/second) to a position apart from the center of the wafer W by 10 to 15 mm, then quickly spraying an $N_2$ gas from the $N_2$ nozzle 62 to the center portion of the wafer W to accelerate drying at the center portion of the wafer W, and scanning the process liquid nozzle 61 from there to the periphery of the wafer W at a speed of 3 mm/second or less is suitably used for it can further suppress generation of water marks at the center portion of the wafer W. Although it is preferable that scanning of the process liquid nozzle 61 to the periphery of the wafer W should be started after spraying of the $N_2$ gas to the center portion of the wafer W is finished, the scanning may be started while spraying of the $N_2$ gas is being carried out.

Figure 9:
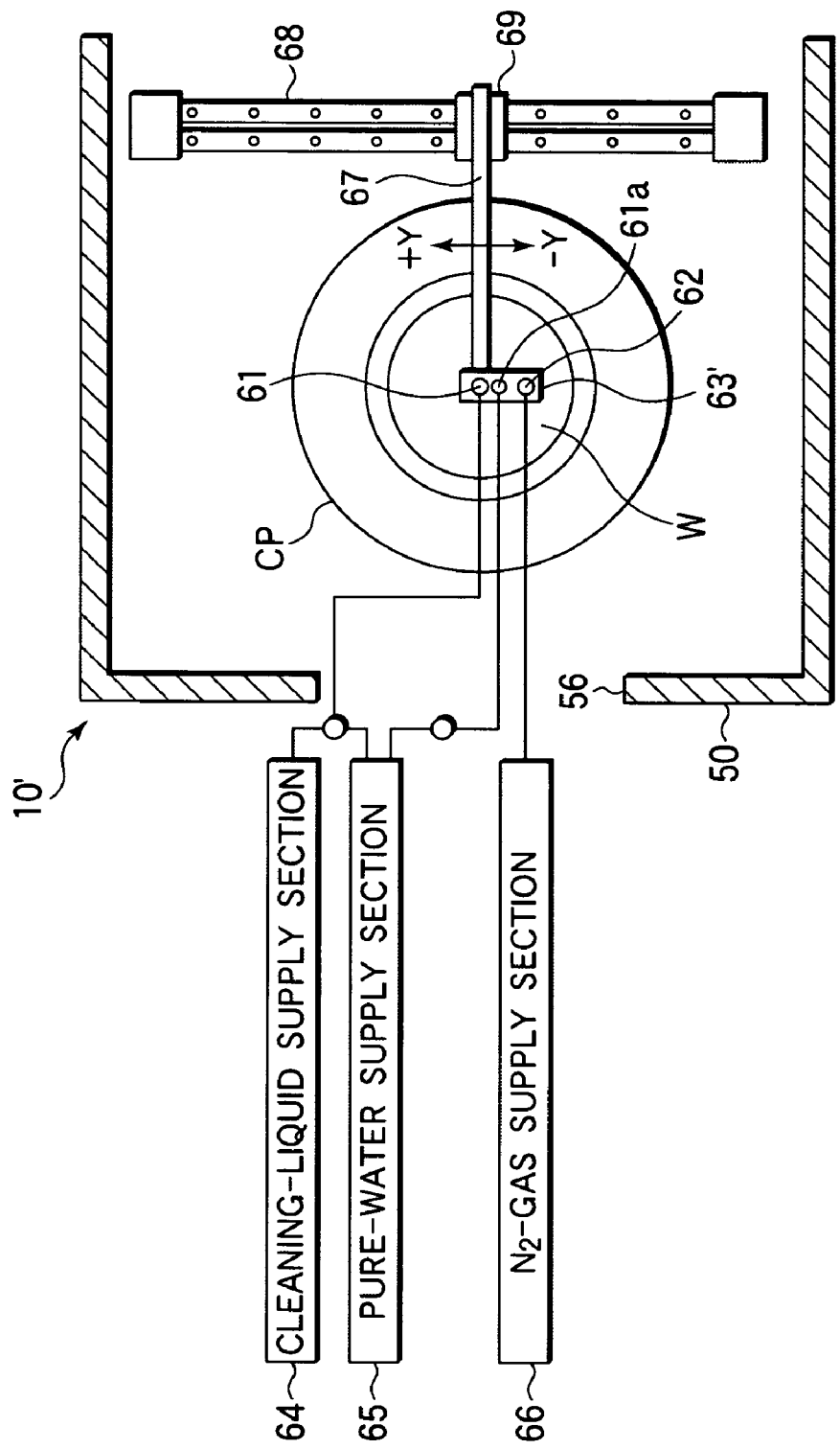
FIG. 9 is a plan view showing the schematic structure of another substrate cleaning apparatus.

Next, another substrate cleaning apparatus which executes the substrate cleaning method according to the present invention will be described. FIG. 9 presents a plan view showing the schematic structure of a substrate cleaning apparatus 10'. The substrate cleaning apparatus 10' has a structure such that a process liquid nozzle 61 which selectively feeds a chemical liquid and pure water to a wafer W, a pure water nozzle 61 which feeds pure water to the wafer W at the time of a spin dry process, and an $N_2$ nozzle 62 which sprays an $N_2$ gas to the wafer W are arranged on a nozzle holding member 63' is attached to the distal end portion of a scan arm 67. Because the structure other than that around the nozzles is the same as that of the substrate cleaning apparatus 10 described previously, the explanation will be omitted.

As described above, in the cleaning process for a wafer W by the substrate cleaning apparatus 10, at the transition from a rinse process to a spin dry process, the amount of pure water to be fed to the wafer W is reduced from 1 L/minute to 20 to 50 mL/minute, for example, the cleaning-liquid nozzle 61, if so structured as to be compatible with the large discharge amount of pure water at the time of the rinse process, may not be able to ensure stable supply of pure water due to the relationship between the piping diameter and the nozzle diameter when the discharge amount of pure water is reduced at the time of the spin dry process. To overcome such a problem, in the substrate cleaning apparatus 10', it is possible to feed pure water to the wafer W from the process liquid nozzle 61 in a process using a cleaning liquid and the rinse process, and feed the pure water to the wafer W from the pure water nozzle 61a at the time of the spin dry process.

In the nozzle holding member 63', the process liquid nozzle 61 and the pure water nozzle 61a are arranged close to each other, and the pure water nozzle 61a and the $N_2$ gas are held apart from each other by a given distance.

Figure 10:
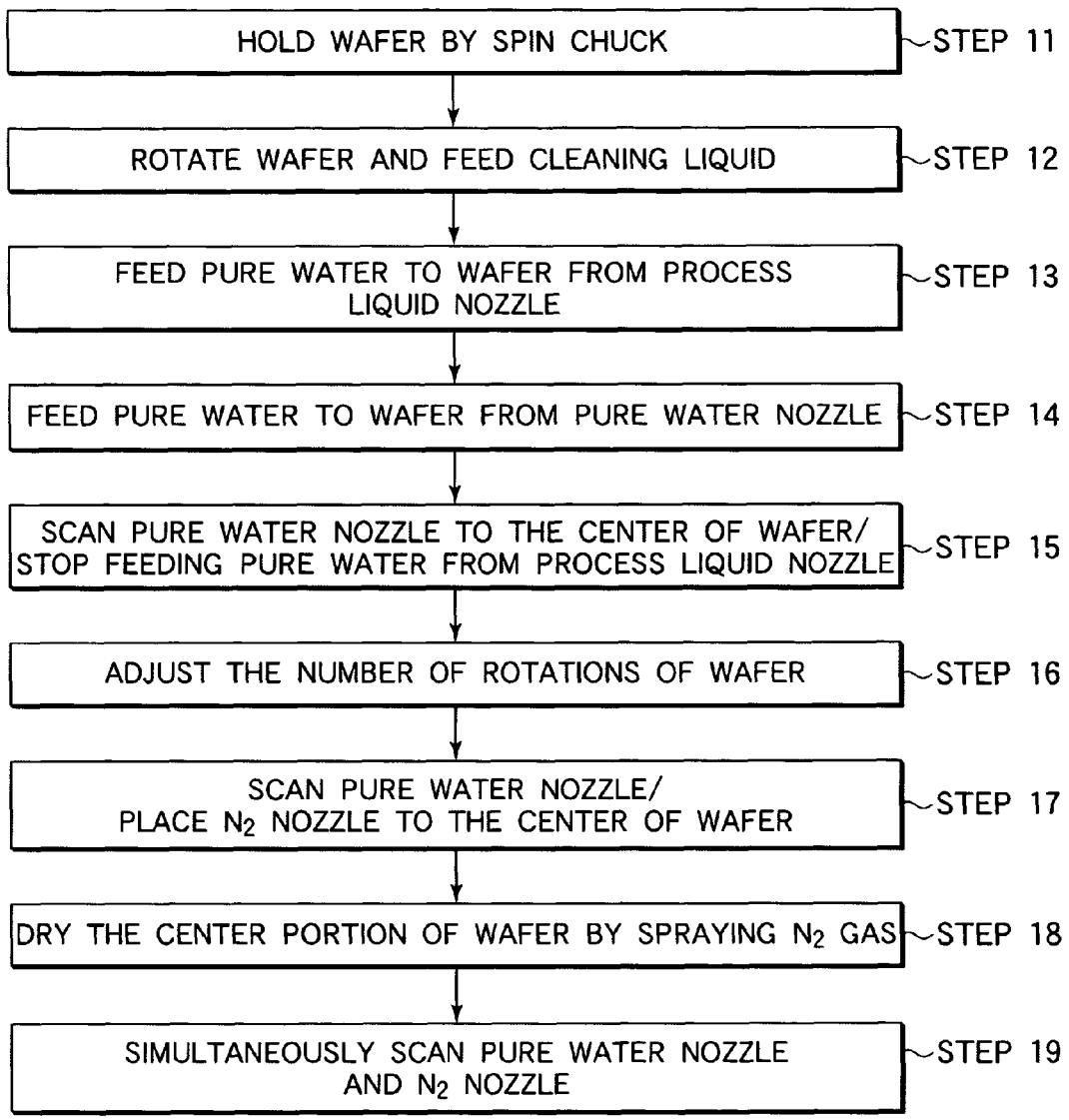
FIG. 10 is a flowchart illustrating another cleaning method.

FIG. 10 presents a flowchart illustrating a first cleaning method for a wafer W by the substrate cleaning apparatus 10'. This method is the process method that moves both the spray point of the $N_2$ gas and the pure-water feed point outward from the center of the wafer W. That is, steps 11 to 13 which are the same processes as those at steps 1 to 3 which have been explained first referring to FIG. 4 are executed. Next, at the end of the rinse process at step 13, the supply of pure water to the wafer W from the pure water nozzle 61 (e.g., 20 to 50 mL/minute) is initiated while keeping feeding pure water to the center of the wafer W from the process liquid nozzle 61 (e.g., 1 L/minute) (step 14).

Then, after the scan arm 67 is driven in the direction of +Y (see FIG. 9) in such a way that the pure water nozzle 61 is positioned above the center of the wafer W, the supply of the pure water to the wafer W from the process liquid nozzle 61 is stopped (step 15). Thereafter, the number of rotations of the wafer W is adjusted to be 800 rpm or greater (step 16). The reason why the number of rotations of the wafer W is reduced this way is because, at subsequent steps, the $N_2$ nozzle 62 and the pure water nozzle 61 are both scanned over the wafer W while spraying the $N_2$ gas to the wafer W from the $N_2$ nozzle 62, thus making it possible to accelerate drying of the wafer W with the $N_2$ gas.

When the number of rotations of the wafer W is adjusted, the scan arm 67 is scanned at a predetermined speed in the direction of +Y (i.e., outward of the wafer W) while feeding the pure water from the pure water nozzle 61 (step 17). When the $N_2$ nozzle 62 reaches above the center of the wafer W this way, driving of the scan arm 67 is temporarily stopped, and the $N_2$ gas is sprayed to the center of the wafer W from the $N_2$ nozzle 62, thereby accelerating uniform drying at the center portion of the wafer W (step 18).

After the $N_2$ gas is sprayed to the center of the wafer W for a predetermined time, the scan arm 67 is driven again in the direction of +Y to simultaneously scan the pure water nozzle 61 and the $N_2$ nozzle 62 while spraying the $N_2$ gas to the wafer W from the $N_2$ nozzle 62 (step 19). Such a method can allow drying to gradually progress outward from the center of the wafer W while shortening the difference between the dry times of the hydrophilic surface and the hydrophobic surface, so that the entire surface of the wafer W can be dried eventually.

Even with the use of the substrate cleaning apparatus 10', a process method which does not spray the $N_2$ gas to the wafer W from the $N_2$ nozzle 62 at the time of scanning the $N_2$ nozzle 62, in which case it is preferable that the number of rotations of the wafer W should be set equal to or greater than 1500 rpm.

Generally, as pure water is fed to a rotating wafer W, the centrifugal force sufficiently acts on the fed pure water at an outer portion of the wafer W, so that drying progresses. Using this, in processing the wafer W using the substrate cleaning apparatus 10', it is possible to employ a method of stopping spraying the $N_2$ gas to the wafer W or a method of reducing the injection amount of the $N_2$ gas when the $N_2$ nozzle 62 approaches the outer peripheral portion of the wafer W. It is also possible to employ a process method which performs spraying of the $N_2$ gas to the wafer W from the $N_2$ nozzle 62 only to the center portion of the wafer W, as per the substrate cleaning apparatus 10. Further, it is possible to employ a process method which scans the scan arm 67 in the direction of +Y at a predetermined speed in such a way that the process liquid nozzle 61 moves outward from the center of the wafer W, and starts spraying the $N_2$ gas to the wafer W when the $N_2$ nozzle 62 reaches the center of the wafer W but does not stop driving the scan arm 67 then.

In case of executing a process similar to the process method which is one of the previously explained spin dry methods, rapidly moves the process liquid nozzle 61 to a position separated from the center of the wafer W by 10 to 15 mm, then sprays the $N_2$ gas to the center portion of the wafer W promptly, and scans the process liquid nozzle 61 to the periphery of the wafer W from there at a speed of 3 mm/second or less by using the substrate cleaning apparatus 10', the $N_2$ nozzle 62 can be made to reach the center of the wafer W at the same time as the pure water nozzle 61 is rapidly moved to a predetermined position if the distance between the pure water nozzle 61 and the $N_2$ nozzle 62 is set to 10 to 15 mm beforehand.

Figure 11:
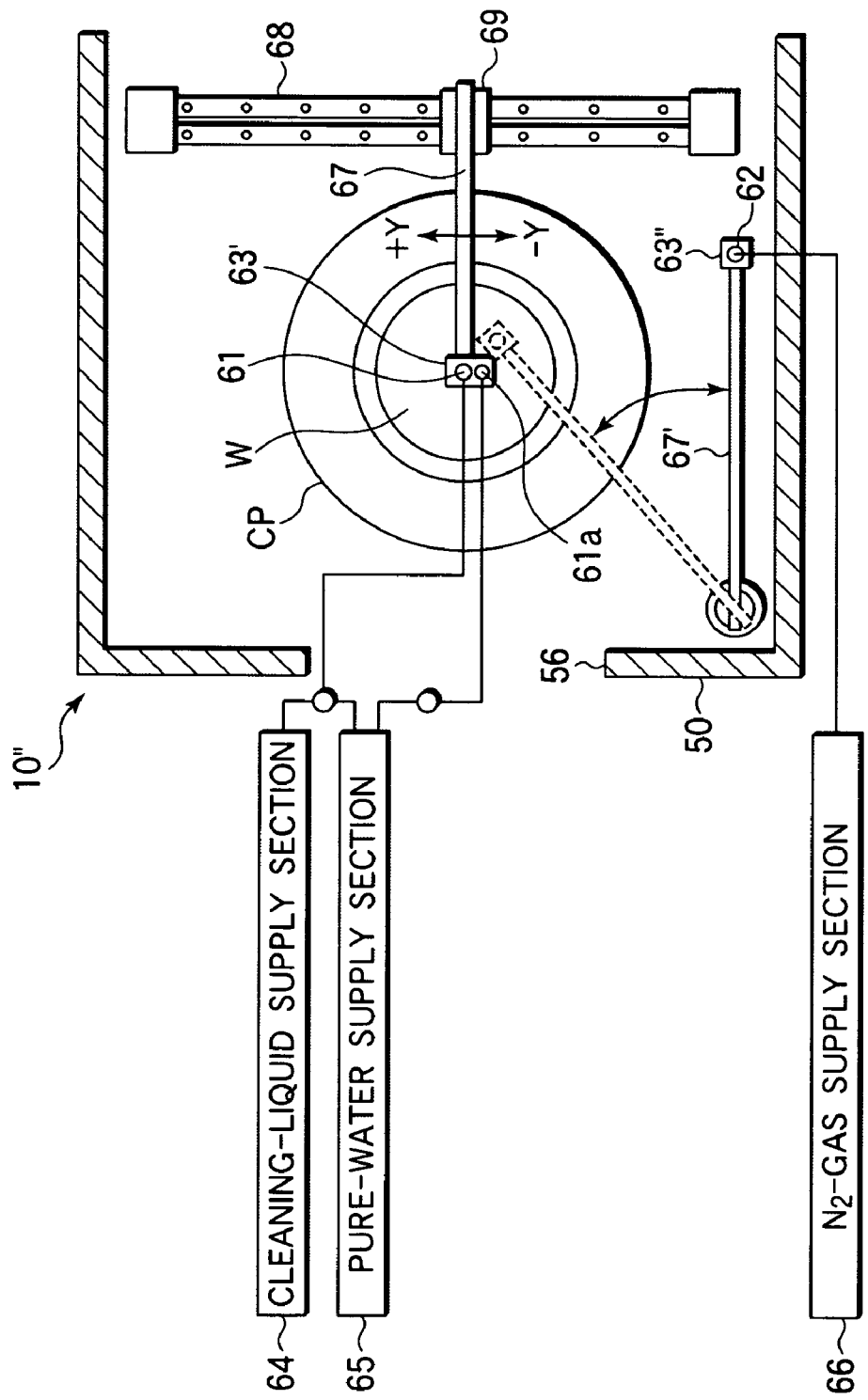
FIG. 11 is a plan view showing the schematic structure of a still another substrate cleaning apparatus.

A still another substrate cleaning apparatus which executes the substrate cleaning method according to the invention will be described next. FIG. 11 presents a plan view showing the schematic structure of a substrate cleaning apparatus Ion. The substrate cleaning apparatus 10" is the substrate cleaning apparatus 10' modified to a structure which can allow the process liquid nozzle 61/the pure water nozzle 61a and the $N_2$ nozzle 62 to independently scan between the center of a wafer W and the periphery thereof, and the structures of the other portions are the same as those of the substrate cleaning apparatus 10'.

In the substrate cleaning apparatus 10", the $N_2$ nozzle 62 is mounted to a nozzle holding member 63" provided at the distal end of a rotatable scan arm 67'. In the spin dry process for a wafer W, when the pure water nozzle 61 is scanned outward from the center of the wafer W, the $N_2$ nozzle 62 always lies in a region within the circumference (indicating a circle about the rotational center of the wafer W) at which the pure water nozzle 61 is positioned, and as the pure water nozzle 61 moves outward of the wafer W, the $N_2$ nozzle 62 is moved outward of the wafer W.

The substrate cleaning apparatus 10" may be modified to a structure which can allow the $N_2$ nozzle 62 to linearly scan in the Y direction through the center of the wafer W, independently of the pure water nozzle 61. In that case, the $N_2$ nozzle 62 may be scanned in such a way as to follow up the pure water nozzle 61, or may be scanned in the opposite direction to that of the pure water nozzle 61. Employing the structure that can independently scan the pure water nozzle 61 and the $N_2$ nozzle 62 can provide a difference between the scan speeds of the pure water nozzle 61 and the $N_2$ nozzle 62.

Although the embodiments of the substrate cleaning method of the invention has been explained above, the invention is not limited to the embodiments. Although in the foregoing description the illustrated process liquid nozzle 61 takes such a structure as to be able to selectively feed the cleaning liquid and pure water to the wafer W, the substrate cleaning apparatus may separately have a nozzle which feeds only the cleaning liquid and a nozzle which feeds only the pure water. It is also preferable that, like the substrate cleaning apparatus 10', the substrate cleaning apparatus 10 should be provided with a pure water nozzle which supplies pure water to the wafer W at the time of the spin dry in addition to the process liquid nozzle 61. In this case, the pure water nozzle may be provided at the nozzle holding member 63, or may be structured in such a way as to be drivable independently of the process liquid nozzle 61. Further, although the process liquid nozzle 61 illustrated has such a structure as to be movable in the direction of the Y axis, the process liquid nozzle, for example, may have a mechanism which rotates about a predetermined rotational axis drawing an arc between the center of the wafer W and the periphery.

While the effect of the substrate cleaning method of the invention of suppressing generation of water marks is obtainable particularly remarkably when a mixture a hydrophobic surface and a hydrophilic surface exists on the surface of a substrate to be processed, the effect can of course be acquired too when the surface of the substrate is comprised only of a hydrophobic surface, or is comprised only of a hydrophilic surface. The substrate is not limited to a semiconductor wafer, but may be a glass substrate for FPD or a ceramic substrate or the like.

The above-described embodiments are intended to clarify the technical contents of the invention, and the invention should not be interpreted as such limited specific examples only, but can be modified and worked out in various manners within the spirit of the invention and the described scope of the claims.

INDUSTRIAL APPLICABILITY

The substrate cleaning method of the invention is suitable for a fabrication method for a semiconductor device or an FDP apparatus.

The invention claimed is:

1. A substrate cleaning method for cleaning target substrates, the method comprising:
   holding a target substrate having a surface with both hydrophobic and hydrophilic areas present thereon in a substantially horizontal state on a holder;
   then, while rotating the target substrate, performing a rinse process on the target substrate by supplying only pure water at a first feed amount onto both the hydrophobic and hydrophilic areas of the target substrate from a pure-water feed point positioned at a center of the surface;
   continuous with the rinse process, and while rotating the target substrate, performing a transition process by reducing the feed amount of the pure water from the first feed amount, while supplying the pure water to the target substrate from the pure-water feed point positioned at the center of the surface without stopping supply of the pure water so as to cause a liquid film formed on the target substrate to be thinner than a liquid film formed during the rinse process;
   continuous with the transition process, and while rotating the target substrate, performing a spin dry process on the target substrate by:
   moving the pure-water feed point outward from the center of the surface while supplying only pure water, from the pure-water feed point, at a second feed amount smaller than the first feed amount to form a film of pure water on the surface of the target substrate outside of the pure-water feed point as the pure-water feed point is moved so as to dry the surface of the target substrate inside of the pure-water feed point, and
   stopping supply of the pure water when the pure-water feed point reaches a position near a peripheral edge of the target substrate while maintaining the rotation of the target substrate for a predetermined time after said stopping supply; and
   finishing the spin dry process by stopping rotation of the target substrate, and unloading the target substrate from the holder without performing any drying process on the target substrate after said stopping rotation.

2. The substrate cleaning method according to claim 1, wherein in said spin dry process, a speed of moving the pure-water feed point to the substrate outward from the center of the substrate is made faster at an outer peripheral portion of the substrate than at the center portion thereof.

3. The substrate cleaning method according to claim 1, wherein in said spin dry process, when the pure-water feed point to the substrate reaches a position separated from the center of the substrate by a predetermined distance, movement of said pure-water feed point is temporarily stopped, and a nitrogen gas is sprayed to the center portion of the substrate, after which spraying of said nitrogen gas is stopped and said pure-water feed point is moved out of the substrate again.

4. The substrate cleaning method according to claim 3, wherein in said spin dry process, the pure-water feed point to the substrate is moved to a position separated from the center of the substrate by 10 to 15 mm, where movement of said pure-water feed point is temporarily stopped, and a nitrogen gas is sprayed to the center portion of the substrate for a predetermined time, after which spraying of said nitrogen gas is stopped and said pure-water feed point is moved out of the substrate again at a speed equal to or less than 3 mm/second.

5. The substrate cleaning method according to claim 1, wherein in said spin dry process, after the pure-water feed point to the substrate is shifted from the center of the substrate by a predetermined distance, a nitrogen gas is sprayed to the center portion of the substrate, after which a spray point of said nitrogen gas is moved, together with said pure-water feed point, outward from the center portion of the substrate while spraying the nitrogen gas to the substrate.

6. The substrate cleaning method according to claim 5, wherein in said spin dry process, only spraying of the nitrogen gas is stopped while moving the spray point of said nitrogen gas, together with said pure-water feed point, outward from the center portion of the substrate.

7. The substrate cleaning method according to claim 5, wherein a number of rotations of the substrate in said rinse process is set equal to or greater than 100 rpm and equal to or less than 1000 rpm, and a number of rotations of the substrate in said spin dry process is set equal to or greater than 800 rpm and equal to or less than 2500 rpm.

8. The substrate cleaning method according to claim 1, wherein a number of rotations of the substrate at a time of the spin dry process is set greater than a number of rotations of the substrate at a time of the rinse process.

9. The substrate cleaning method according to claim 8, wherein a number of rotations of the substrate in said rinse process is set equal to or greater than 100 rpm and equal to or less than 1000 rpm, and a number of rotations of the substrate in said spin dry process is set equal to or greater than 1500 rpm and equal to or less than 2500 rpm.

10. The substrate cleaning method according to claim 1, wherein the transition process comprises reducing a feed amount of the pure water from the first feed amount to the second feed amount.

11. The substrate cleaning method according to claim 1, wherein the transition process comprises setting a number of rotations of the target substrate at a value higher than that of the rinse process.

12. The substrate cleaning method according to claim 11, wherein the transition process comprises increasing the number of rotations of the target substrate to a value to be used in the spin dry process.

\* \* \* \* \*